United States Patent
Tserng et al.

(10) Patent No.: US 8,754,496 B2
(45) Date of Patent: Jun. 17, 2014

(54) FIELD EFFECT TRANSISTOR HAVING A PLURALITY OF FIELD PLATES

(75) Inventors: Hua-Quen Tserng, Dallas, TX (US); Deep C. Dumka, Richardson, TX (US); Martin E. Jones, Plano, TX (US); Charles F. Campbell, McKinney, TX (US); Anthony M. Balistreri, Plano, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 185 days.

(21) Appl. No.: 12/423,776

(22) Filed: Apr. 14, 2009

(65) Prior Publication Data
US 2010/0259321 A1    Oct. 14, 2010

(51) Int. Cl.
*H01L 29/778* (2006.01)

(52) U.S. Cl.
USPC 257/488; 257/194; 257/E29.01; 257/E29.246

(58) Field of Classification Search
CPC .... H01L 29/402; H01L 29/404; H01L 29/407
USPC .................. 257/194, 195, 487–490, 257/E29.006–E29.011, E29.246–E29.248, 257/E29.252, E21.403, E21.407
See application file for complete search history.

(56) References Cited

U.S. PATENT DOCUMENTS

| | | | |
|---|---|---|---|
| 6,559,513 B1 * | 5/2003 | Miller et al. | 257/488 |
| 6,867,078 B1 | 3/2005 | Green et al. | |
| 7,126,426 B2 | 10/2006 | Mishra et al. | |
| 2005/0062069 A1 | 3/2005 | Saito et al. | |
| 2005/0116253 A1 | 6/2005 | Yamane | |
| 2005/0253168 A1 | 11/2005 | Wu et al. | |
| 2006/0006415 A1 | 1/2006 | Wu et al. | |
| 2006/0043416 A1 | 3/2006 | Li et al. | |
| 2006/0118809 A1 | 6/2006 | Parikh | |
| 2006/0138454 A1 | 6/2006 | Saito | |

(Continued)

FOREIGN PATENT DOCUMENTS

| | | |
|---|---|---|
| JP | 2000-077615 | 3/2000 |
| JP | 2003-332357 | 11/2003 |

(Continued)

OTHER PUBLICATIONS

Ando, Yuji, et al., Novel AlGaN/GaN Dual-Field Plate FET with High Gain, Increased Linearity and Stability; article; 4 pages; 2005 IEEE, Aug. 2005.

(Continued)

*Primary Examiner* — Yu Chen
(74) *Attorney, Agent, or Firm* — Schwabe Williamson & Wyatt

(57) ABSTRACT

Embodiments include but are not limited to apparatuses and systems including a field-effect transistor switch. A field-effect transistor switch may include a first field plate coupled with a gate electrode, the first field plate disposed substantially equidistant from a source electrode and a drain electrode. The field-effect transistor switch may also include a second field plate proximately disposed to the first field plate and disposed substantially equidistant from the source electrode and the drain electrode. The first and second field plates may be configured to reduce an electric field between the source electrode and the gate electrode and between the drain electrode and the gate electrode.

20 Claims, 7 Drawing Sheets

(56) References Cited

U.S. PATENT DOCUMENTS

| | | |
|---|---|---|
| 2006/0202272 A1 | 9/2006 | Wu |
| 2007/0018210 A1 | 1/2007 | Sheppard |
| 2007/0114569 A1 | 5/2007 | Wu |
| 2007/0164322 A1* | 7/2007 | Smith et al. ............... 257/256 |
| 2007/0235775 A1 | 10/2007 | Wu |
| 2007/0272957 A1 | 11/2007 | Johnson et al. |
| 2008/0116492 A1 | 5/2008 | Wu |
| 2009/0032820 A1 | 2/2009 | Chen |
| 2009/0108299 A1* | 4/2009 | Smorchkova et al. ........ 257/194 |
| 2009/0256210 A1 | 10/2009 | Matsushita et al. |

FOREIGN PATENT DOCUMENTS

| | | |
|---|---|---|
| JP | 2005-159157 | 6/2005 |
| JP | 2007-526633 | 9/2005 |
| JP | 2006-165387 | 6/2006 |
| JP | 2008-533717 | 9/2006 |
| JP | 2008-277640 | 11/2008 |
| JP | 2009032724 A | 2/2009 |
| WO | WO2007-126541 | 11/2007 |
| WO | WO 2008069074 A1 | 6/2008 |

OTHER PUBLICATIONS

Chiu, et al., Microwave performance of AiGaAs/I>nGaAs pseudomorphic HEMTs with tuneable field-plat voltage. Semicond. Sci. Teachnol. 21, No. 10, pp. 1432-1436, 2006.

Ishikura, K., et al., A 28V over 300 W GaAs Heterojunction FET with Dual Field-Modulating-Plates for W-CDMA Base Stations; article; 4 pages; 2005 IEEE, Jan. 2005.

Verzellesi, et al., DC-to-RF dispersion effect in GaAs and GaN-based heterostructure FETs; performance and reliability issues; Microelectronics Reliability 45, pp. 1585-1592, 2005.

Wakejima, et al., A GaAs—Based Field-Modulating Plate HFET with Improved WCDMA Peak-Output-Power Characteristics, IEEE Transactions on Electrode Devices, vol. 50, No. 9, pp. 1983-1987, 2003.

Wu, Y.F., et al., High-gain Microwave GaN HEMTs with Source-terminated Field-plates; article; pp. 33.7.1-33.7.2; 2004 IEEE; Jan. 2004.

Xing, Huili, et al., High Breakdown Voltage AlGaN-GaN HEMTs Achieved by Multiple Field Plates; article; pp. 161-163; IEEE Electron Device Letters, vol. 2, No. 4.

English translation of Office Action in Japanese Patent Application No. 2012-506039 dated Jan. 28, 2014.

* cited by examiner

FIELD EFFECT TRANSISTOR HAVING A PLURALITY OF FIELD PLATES

TECHNICAL FIELD

Embodiments of the present disclosure relate generally to microelectronic devices and more particularly to field-effect transistors including a plurality of field plates and circuits incorporating the same.

BACKGROUND

High power field-effect transistor (FET) switches are used in radio-frequency/microwave circuits in wireless communications and radar systems. For high power switching, series and shunt connected FET switches may be used. The power handling capability of these systems may be limited, however, by the radio-frequency breakdown voltage between the source and the drain of the FET switch.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The phrase "formed on," along with its derivatives, may be used herein. "Formed on" in the context of "a layer being formed on another layer" may mean that a layer is formed above, but not necessarily in direct physical or electrical contact with, another layer, e.g., there may be one or more other layers interposing the layers. In some embodiments, however, "formed on" may mean that a layer is in direct physical contact with at least a portion of a surface of another layer.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

Figure 1:
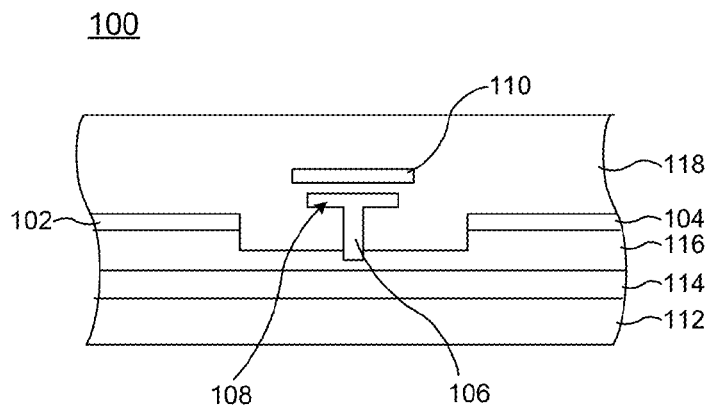
FIG. 1 is a sectional view of a FET switch including symmetric field plates in accordance with various embodiments.
Figure 2:
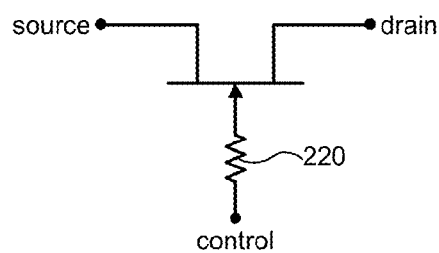
FIG. 2 is a circuit diagram of the FET switch of FIG. 1 in accordance with various embodiments.

Turning now to FIG. 1, illustrated is a cross-sectional view of a field-effect transistor (FET) switch 100 in accordance with various embodiments. FIG. 2 is a circuit representation of the FET switch 100 in accordance with various embodiments.

Figure 3:
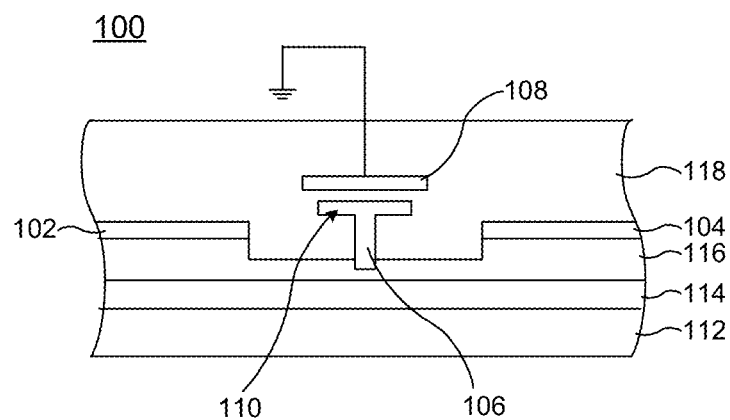
FIG. 3 is a sectional view of another FET switch including symmetric field plates in accordance with various embodiments.

As illustrated, the FET switch 100 includes a source electrode 102, a drain electrode 104, and a gate electrode 106. The gate electrode 106 may also include a first field plate 108, integrally formed with the gate electrode 106, as illustrated. This gate structure may be referred to as a T-gate. The transistor 100 also includes a second field plate 110 proximately disposed to the first field plate 108, and which may be left floating, as illustrated, or may be configured to couple to a ground source, as illustrated in FIG. 3. As with conventional FET switches, the FET switch 100 may be operated by grounding both the source electrode 102 and the drain electrode 104, with the gate electrode 106 acting as the control terminal for the application of a control voltage, usually by way of a resistor 220, for bi-directional switching.

The first and second field plates 108, 110 are disposed substantially equidistant from the source electrode 102 and the drain electrode 104. The gate electrode 106 may also be substantially equidistant from the source electrode 102 and the drain electrode 104. In various embodiments, disposing the first and second field plates 108, 110 substantially equidistant from the source electrode 102 and the drain electrode 104 may have the effect of reducing the electric field in the gate-source region between the gate electrode 106 and the source electrode 102, and also in the gate-drain region between the gate electrode 106 and the drain electrode 104. Although the T-gate structure alone may increase the breakdown voltage to a degree, the addition of the symmetrical field plate 108 may further increase the breakdown voltage. Moreover, this enhancement in breakdown voltage may increase the power handling capability of devices incorporating the FET switch 100.

The FET switch 100 may be any one of various FETs suitable for microwave- or millimeter-wave power amplification applications. Examples of FETs may include a high electron mobility transistor (HEMT) (e.g., an aluminum gallium nitride (AlGaN)/gallium nitride (GaN) HEMT), a pseudomorphic HEMT (PHEMT) (e.g., a gallium arsenide (GaAs) PHEMT), a metamorphic HEMT (mHEMT) (e.g., a GaAs mHEMT), a laterally diffused metal oxide semiconductor transistor (LDMOS), or a metal epitaxial semiconductor field effect transistor (MESFET).

As illustrated, the FET switch 100 is generally a FET including a barrier layer 116 and a channel layer 114 formed on a substrate 112. The substrate 112 may comprise any material suitable for the application. For various embodiments, for example, the substrate 112 comprises GaAs. In other embodiments, however, the substrate 112 may comprise GaN. Another material or combination of materials may be similarly suitable. For example, the substrate 112 may comprise silicon carbide, silicon, sapphire, aluminum nitride, or some combination thereof or some combination with another suitable material.

The channel layer 114 may comprise one or more layers with a desired band gap. In various embodiments, the channel layer 114 may comprise one or more doped or undoped GaAs layers or indium gallium arsenide (InGaAs) layers. Other materials may be similarly suitable including, for example, GaN. In various embodiments, the channel layer 114 may comprise the same material as the substrate 112. In other embodiments, however, the channel layer 114 may comprise a material different than the material forming the substrate 112.

The barrier layer 116 may comprise any material suitable for the application. In various embodiments, the barrier layer 116 comprises aluminum gallium arsenide (AlGaAs). Another material or combination of materials may be similarly suitable. For example, the barrier layer 116 may comprise AlGaN. The barrier layer 116 may be doped or undoped, depending on the application.

The gate electrode 106 may be partially recessed into barrier layer 116 as illustrated. The distance the gate electrode 106 is recessed may depend on the desired frequency operation of the FET switch 100. For example, in some embodiments wherein the FET switch 100 is to be operated at a frequency of approximately 3.5 GHz, the gate electrode 106 may have a gate length of approximately 0.6 to 0.7 microns and may be recessed approximately 200 Angstroms. In various other embodiments, the gate electrode 106 may be recessed further into the barrier layer 116 or may instead not be recessed at all.

The gate electrode 106 and the first and second field plates 108, 110 may comprise any material suitable for the purpose. According to various embodiments, the gate electrode 106 and/or the field plates 108, 110 may comprise gold (Au), nickel-gold (Ni—Au), or titanium-platinum-gold (Ti/Pt/Au). Other metals may be similarly suitable, depending on the application.

The FET switch 100 may include a dielectric material 118 formed over one or more layers of the FET switch 100. In the illustrated embodiments, the dielectric material 118 is formed over the source electrode 102, the drain electrode 104, the second field plate 110, and also over portions of the gate electrode 106 and the barrier layer 116. The dielectric material 118 may also be formed between the second field plate 110 and the first field plate 108 as illustrated.

Although not illustrated, the dielectric material 118 may be formed as a plurality of layers, the layers comprising layers of the same material or layers of two or more different materials. In various embodiments, one or more layers of the dielectric material 118 comprise silicon nitride or silicon dioxide. Other dielectric material may be similarly suitable.

Figure 4:
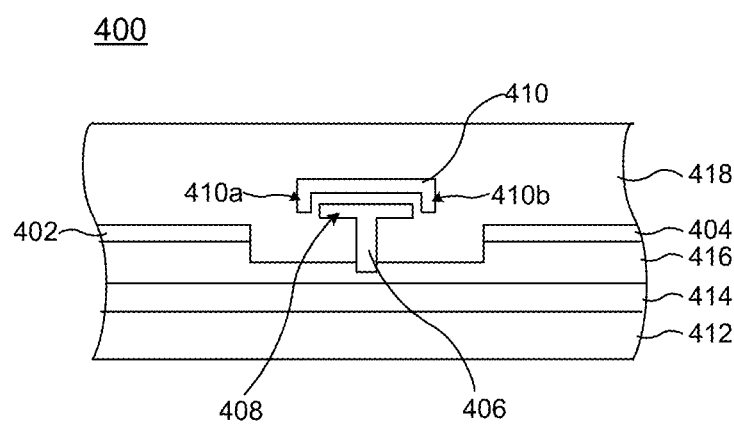
FIG. 4 is a sectional view of another FET switch including symmetric field plates in accordance with various embodiments.

FIG. 4 illustrates another embodiment of a FET switch 400. As illustrated, the FET switch 400 includes some of the features of the FET switch 100 described herein with respect to FIGS. 1-3, including, for example, a barrier layer 416 and a channel layer 414 formed on a substrate 412, and a dielectric material 418 overlying the same. The FET switch 400 also includes a source electrode 402, a drain electrode 404, and a gate electrode 406 with an integral first field plate 408.

The FET switch 400 also includes a second field plate 410 disposed substantially equidistant from the source electrode 402 and the drain electrode 404. Rather than being substantially flat like the second field plate 110 of the FET switch 100 illustrated in FIGS. 1 and 3, however, the second field plate 410 of the FET switch 400 includes edges 410a, 410b that are folded over toward the active area of the FET switch 400, i.e., toward the barrier layer 416. In various embodiments, folding the edges 410a, 410b over toward the active area of the FET switch 400 may have the effect of further reducing the electric field in the gate-source region and in the gate-drain region, and may further increase the breakdown voltage. Moreover, this increase in breakdown voltage may increase the power handling capability of the FET switch 400.

Figure 5:
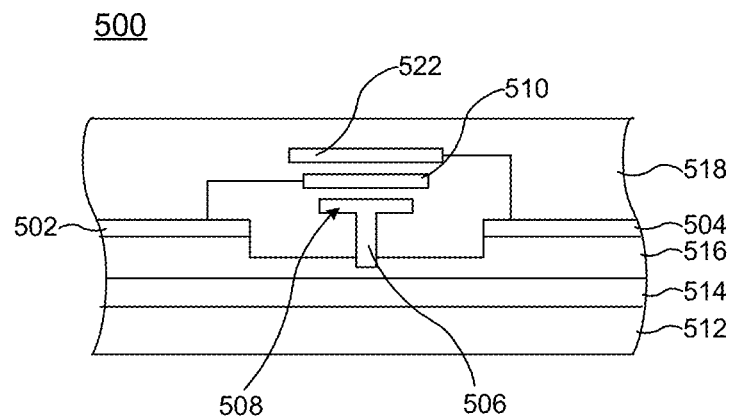
FIG. 5 is a sectional view of another FET switch including symmetric field plates in accordance with various embodiments.

FIG. 5 illustrates another embodiment of a FET switch 500. As illustrated, the FET switch 500 includes some of the features of the FET switch 100 described herein with respect to FIGS. 1-3, including, for example, a barrier layer 516 and a channel layer 514 formed on a substrate 512, and a dielectric material 518 overlying the same. The FET switch 500 also includes a source electrode 502, a drain electrode 504, a gate electrode 506 with an integral first field plate 508, and a second field plate 510.

The FET switch 500 also includes a third field plate 522 proximately disposed to the second field plate 510. Like the first and second field plates 508, 510, the third field plate 522 is disposed substantially equidistant from the source electrode 502 and the drain electrode 504. One or both of the second and third field plates 510, 522 may be configured to float or couple to ground, or may be configured such that the second field plate 510 is coupled with the source electrode 502 while the third field plate 522 is coupled with the drain electrode 504, as shown.

In various embodiments, the addition of the third field plate 522 may have the effect of further reducing the electric field in the gate-source region and in the gate-drain region, and may further increase the breakdown voltage. Moreover, this increase in breakdown voltage may increase the power handling capability of the FET switch 500.

Figure 6:
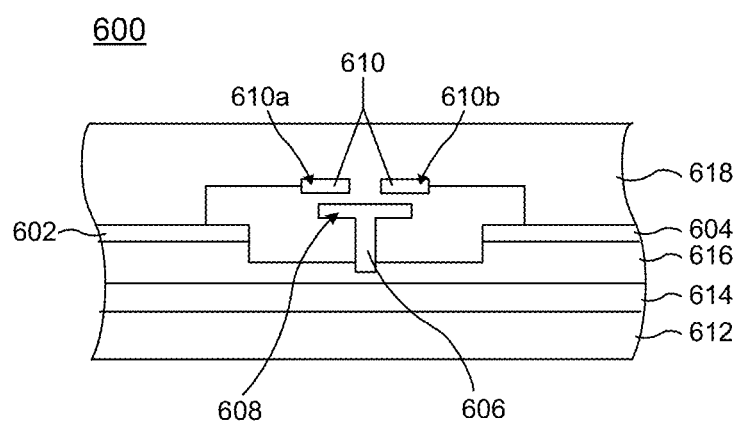
FIG. 6 is a sectional view of another FET switch including symmetric field plates in accordance with various embodiments.

FIG. 6 illustrates another embodiment of a FET switch 600. As illustrated, the FET switch 600 includes some of the features of the FET switch 100 described herein with respect to FIGS. 1-3, including, for example, a barrier layer 616 and a channel layer 614 formed on a substrate 612, and a dielectric material 618 overlying the same. The FET switch 600 also includes a source electrode 602, a drain electrode 604, and a gate electrode 606 with an integral first field plate 608.

The FET switch 600 also includes a second field plate 610. Rather than being a unitary piece of material like the second field plate 110 of the FET switch 100 illustrated in FIGS. 1 and 3, however, the second field plate 610 of the FET switch 600 includes a first field plate section 610a and a second field plate section 610b which is separate from the first field plate section 610a, as illustrated. The first and second field plate sections 610a, 610b may be configured to float or couple to ground, or may be configured such that the first field plate section 610a is coupled with the source electrode 602, while the second field plate section 610b is coupled with the drain electrode 604.

In various embodiments, the second field plate 610 including two field plate sections 610a, 610b may have the effect of further reducing the electric field in the gate-source region and in the gate-drain region, and may further increase the breakdown voltage. Moreover, this increase in breakdown voltage may increase the power handling capability of the FET switch 600.

Figure 7:
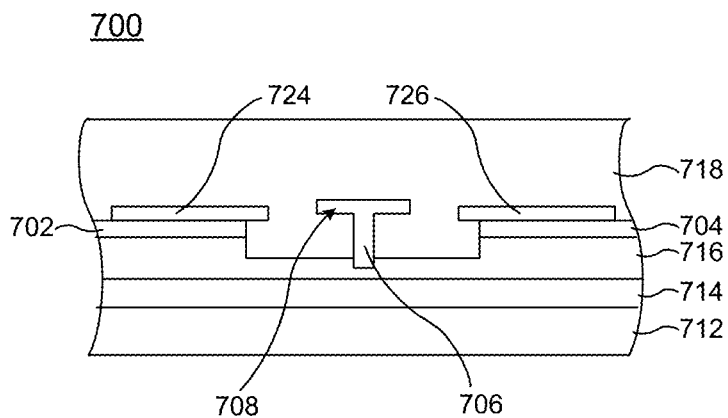
FIG. 7 is a sectional view of another FET switch including symmetric field plates in accordance with various embodiments.

FIG. 7 illustrates still another embodiment of a FET switch 700. As illustrated, the FET switch 700 includes some of the features of the FET switch 100 described herein with respect to FIGS. 1-3, including, for example, a barrier layer 716 and a channel layer 714 formed on a substrate 712, and a dielectric material 718 overlying the same. The FET switch 700 also includes a source electrode 702, a drain electrode 704, and a gate electrode 706 with an integral first field plate 708.

The FET switch 700 also includes a second field plate 724 and a third field plate 726. Rather than being disposed over the first field plate 708 like the second field plate 110 of the FET switch 100 illustrated in FIGS. 1 and 3, however, the second field plate 724 is disposed on the source electrode 702, and a third field plate 726 is disposed on the drain electrode 704. The second field plate 724 may overhang the source electrode 702 toward the gate electrode 706, as illustrated. Similarly, the third field plate 726 may overhang the drain electrode 704 toward the gate electrode 706.

In various embodiments, disposing the second field plate 724 on the source electrode 702, and the third field plate 726 on the drain electrode 704 may have the effect of further reducing the electric field in the gate-source region and in the gate-drain region, and may further increase the breakdown voltage. Moreover, this increase in breakdown voltage may increase the power handling capability of the FET switch 700.

Figure 8:
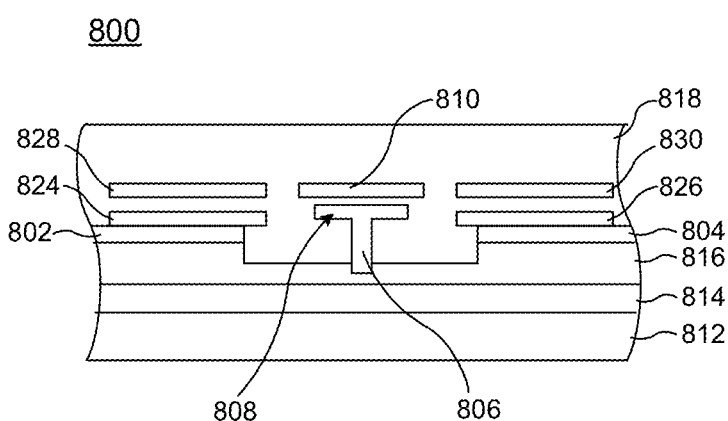
FIG. 8 is a sectional view of another FET switch including symmetric field plates in accordance with various embodiments.

FIG. 8 illustrates still another embodiment of a FET switch 800. As illustrated, the FET switch 800 includes some of the features of the FET switch 700 described herein with respect to FIG. 7, including, for example, a barrier layer 816 and a channel layer 814 formed on a substrate 812, and a dielectric material 818 overlying the same. The FET switch 800 also includes a source electrode 802, a drain electrode 804, and a gate electrode 806 with an integral first field plate 808. In addition, the FET switch 800 includes a second field plate 824 disposed on the source electrode 802, and a third field plate 826 disposed on the drain electrode 804.

The FET switch 800 also includes a fourth field plate 828 proximately disposed to the second field plate 824, and a fifth field plate 830 proximately disposed to the third field plate 826. In addition, another field plate 810 may be proximately disposed to the first field plate 808 and disposed substantially equidistant from the source electrode 802 and the drain electrode 804. The use of additional field plates may further increase the breakdown voltage and the reduction of the electric field in the gate-source and gate-drain regions.

In various embodiments, the addition of fourth and fifth field plates 828, 830 (or even more field plates than shown) may have the effect of further reducing the electric field in the gate-source region and in the gate-drain region, and may further increase the breakdown voltage, as with other embodiments discussed herein. Moreover, this increase in breakdown voltage may increase the power handling capability of the FET switch 800.

Figure 9:
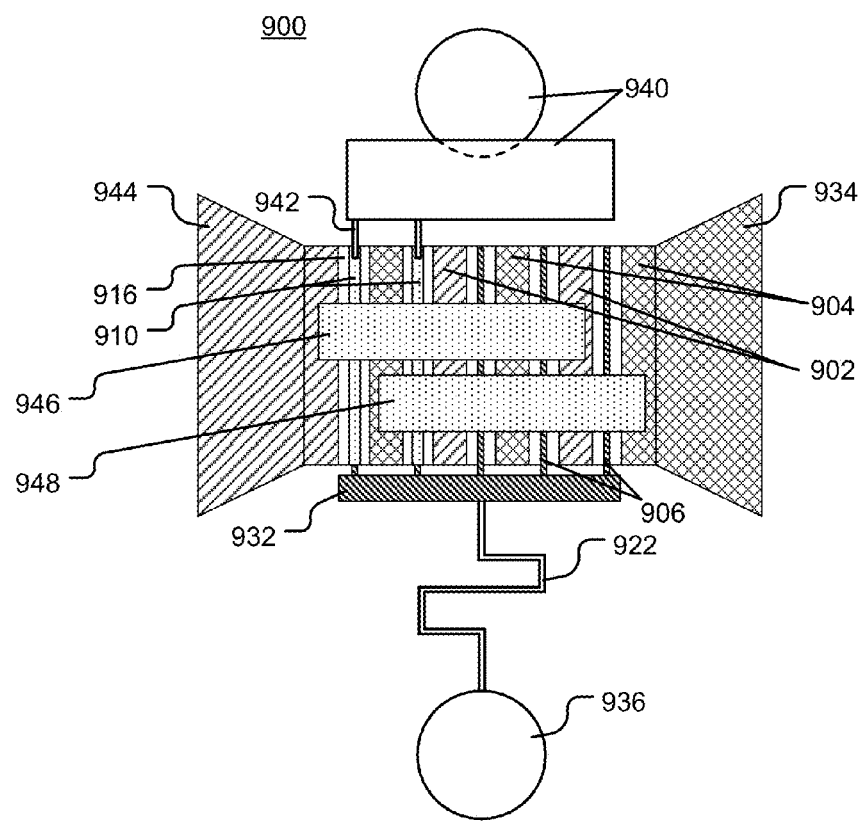
FIG. 9 is a top view of a unit cell including a plurality of FET switches including symmetric field plates in accordance with various embodiments.

The FET switches described herein may be incorporated into a unit cell of a switch circuit. FIG. 9 is a top view of an example unit cell including six individual FETs. It should be noted, however, that a unit cell may comprise any number of transistors.

As illustrated in FIG. 9, a unit cell 900 includes a plurality of gate electrodes 906, e.g., gate fingers, on, or recessed in, a barrier layer 916; a plurality of drain electrodes 904, e.g., drain fingers; and a plurality of source electrodes 902, e.g., source fingers. The unit cell 900 may include a gate pad 932 for connecting to the gate electrodes 906, a source pad 944 for connecting to the source electrodes 902, and a drain pad 934 for connecting to the drain electrodes 904. The source electrodes 902 may be interconnected by a source interconnect bridge 946, while the drain electrodes 904 may be interconnected by a drain interconnect bridge 948. In various embodiments, the interconnect bridges 946, 948 may be air bridges.

Each of the individual transistors may be formed by one of the source electrodes 902, one of the gate electrodes 906, and one of the drain electrodes 904. The gate electrode 906 may include integral first field plates (not illustrated), each of the first field plates being substantially equidistant from adjacent source and drain electrodes 902, 904. In addition, as discussed herein, each of the individual transistors may include a second field plate 910 proximately disposed to the first field plates and also being substantially equidistant from adjacent source and drain electrodes 902, 904 similar to the structure of the FET switch 100 illustrated in FIG. 1. For simplicity, only two of the second field plates 910 are illustrated in FIG. 9. In various other embodiments, the individual transistors may instead have a structure like one of those discussed herein with reference to FIGS. 4-8.

The unit cell 900 further comprises a control pad 936 for coupling with a control voltage. The control voltage may then be provided to the gate structure 932 by way of a series resistor 922.

As discussed herein, field plates may be configured to float or couple with a ground source. For the unit cell 900 illustrated in FIG. 9, the second field plates 910 are coupled with a grounding pad 940 by way of interconnects 942. The grounding pad 940 may be configured for coupling with a ground source.

Figure 10:
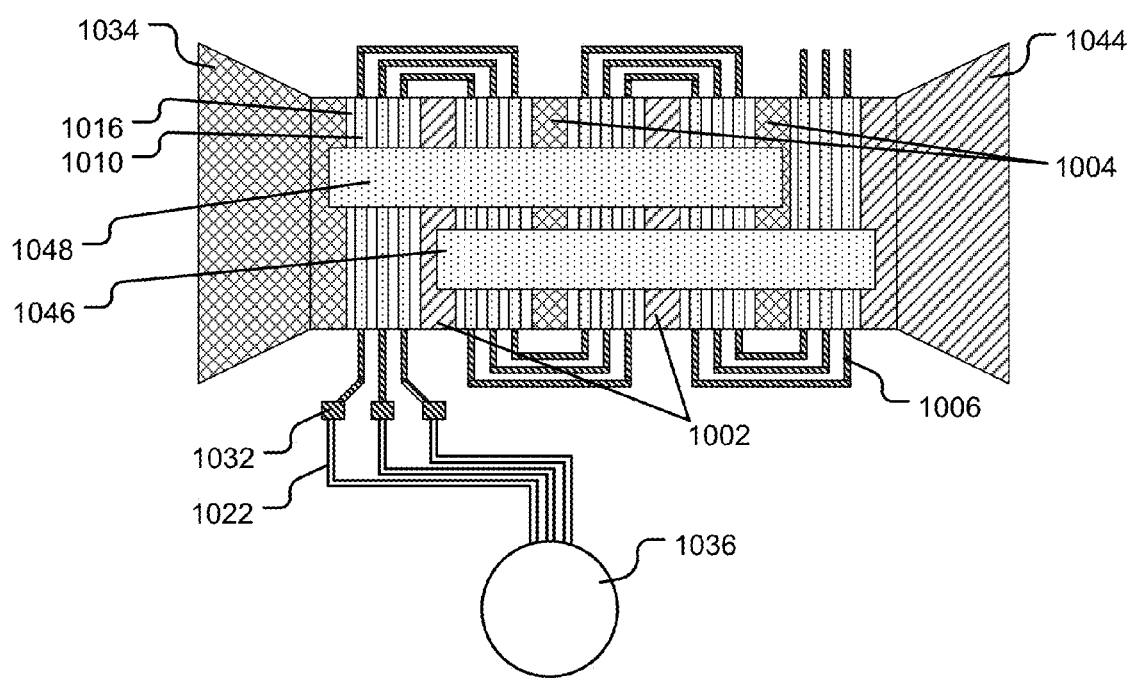
FIG. 10 is a top view of another unit cell including a plurality of FET switches including symmetric field plates in accordance with various embodiments.

In various embodiments, FET switches and unit cells incorporating FET switches may employ a triple gate structure. An example unit cell 1000 including a triple gate structure is illustrated in FIG. 10.

As illustrated, the unit cell 1000 includes some of the features of the unit cell 900 described herein with respect to FIG. 9, including, for example, a plurality of gate electrodes 1006 (e.g., gate fingers) on or recessed in a barrier layer 1016;

a plurality of drain electrodes 1004 (e.g., drain fingers); and a plurality of source electrodes 1002 (e.g., source fingers). The unit cell 1000 may include gate pads 1032 for connecting to the gate electrodes 1006, a source pad 1044 for connecting to the source electrodes 1002, and a drain pad 1034 for connecting to the drain electrodes 1004. The source electrodes 1002 may be interconnected by a source interconnect bridge 1046, while the drain electrodes 1004 may be interconnected by a drain interconnect bridge 1048.

Rather than including just a single gate electrode 1006 between adjacent source 1002 and drain electrodes 1004, the illustrated embodiment includes three gate electrodes 1006 between adjacent source 1002 and drain electrodes 1004. Each of the gate electrodes 1006 may also include integral first field plates (not illustrated). The first field plates of the gate electrode 1006 trio may be configured such that the first field plates are disposed substantially equidistant from each other, with the middle gate electrode 1006 being substantially equidistant from the adjacent source electrode 1002 and the adjacent drain electrode 1004. The gate electrodes 1006 may also be substantially equidistant from each other.

In addition, as discussed herein, each of the individual transistors may include a second field plate 1010 proximately disposed to the first field plates. The second field plates 1010 may be substantially equidistant from adjacent second field plates 1010, with the middle field plate 1010 being substantially equidistant from the adjacent source electrode 1002 and the adjacent drain electrode 1004. In various other embodiments, the individual transistors may instead have a structure like one of those discussed herein with reference to FIGS. 4-8.

The unit cell 1000 further comprises a control pad 1036 for coupling with a control voltage. The control voltage may then be provided to the gate electrodes 1006 by way of interconnects 1022.

As discussed herein, field plates may be configured to float or couple with a ground source. For the unit cell 1000 illustrated in FIG. 10, the second field plates 1010 are floating. In other embodiments, the second field plates 1010 may be coupled with a ground source in a manner similar to the unit cell 900 described with reference to FIG. 9.

Figure 11:
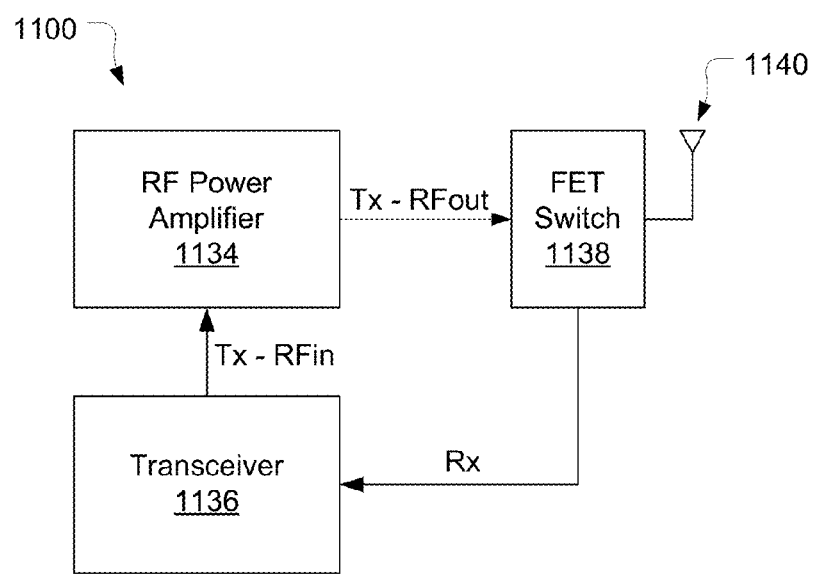
FIG. 11 is a block diagram of a system incorporating a FET switch including symmetric field plates in accordance with various embodiments.

Embodiments of packages described herein may be incorporated into various apparatuses and systems. A block diagram of an exemplary system 1100 is illustrated in FIG. 11. As illustrated, the system 1100 includes an RF power amplifier 1134. The system 1100 may include a transceiver 1136 coupled with the RF power amplifier 1134 as shown.

The RF power amplifier 1134 may receive an RF input signal, RFin, from the transceiver 1136. The RF power amplifier 1134 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 11.

The amplified RF output signal, RFout, may be provided to a FET switch 1138. The FET switch 1138 may effectuate an over the air (OTA) transmission of the RF output signal, RFout, via an antenna structure 1140. The FET switch 1138 may also receive RF signals via the antenna structure 1140 and couple the received RF signals, Rx, to the transceiver 1136 along a receive chain. The FET switch 1138 may include transistors with additional field plates to reduce the electric field in the gate-source and gate-drain regions, and increase the breakdown voltage as described herein. The use of these transistors in the FET switch 1138 may provide the FET switch 1138 with the ability to accommodate high RF voltage swings that may be associated with high power switching.

In various embodiments, the antenna structure 1140 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1100 may be any system including power amplification. In various embodiments, the system 1100 may be particularly useful for power amplification at high radio frequency power and frequency. For example, the system 1100 may be suitable for any one or more of terrestrial and satellite communications, radar systems, and possibly in various industrial and medical applications. Radar applications may include military-use radar, air traffic control, navigation, and the like.

In various embodiments, the system 1100 may be a selected one of a radar device, a satellite communication device, a mobile handset, a cellular telephone base station, a broadcast radio, or a television amplifier system. The system 1100 may find applicability in other applications in which power amplification for high frequency transmission and/or reception is required.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
  a transistor including a channel layer, a barrier layer formed over the channel layer, a source electrode over the barrier layer, a drain electrode over the barrier layer, and a t-gate, wherein the t-gate includes a gate electrode and a first field plate coupled with the gate electrode such that the gate electrode and the first field plate are disposed substantially equidistant from the source electrode and the drain electrode and the first field plate is configured to reduce an electric field between the source electrode and the gate electrode and between the drain electrode and the gate electrode;
  a second field plate separated from the first field plate by a dielectric layer and disposed substantially equidistant from the source electrode and the drain electrode, and configured to further reduce the electric field between the source electrode and the gate electrode and between the drain electrode and the gate electrode; and
  a ground pad coupled with the second field plate by an interconnect for providing a ground voltage to the second field plate, and the second field plate is electrically decoupled from the source electrode and the drain electrode.

2. The apparatus of claim 1, wherein the second field plate comprises a first plate section and a second plate section separate from the first plate section.

3. The apparatus of claim 1, wherein the second field plate includes a first edge and a second edge, the first and second edges being folded toward an active area of the transistor.

4. The apparatus of claim 1, further comprising a third field plate proximately disposed to the second field plate and disposed substantially equidistant from the source electrode and the drain electrode.

5. The apparatus of claim 1, further comprising a plurality of other transistors similarly constituted to the transistor and connected in parallel with the transistor, wherein the transistor and the plurality of other transistors are formed by a plurality of t-gates, a plurality of second field plates, a plurality of source electrodes, and a plurality of drain electrodes.

6. The apparatus of claim 5, further comprising a control pad coupled with the plurality of t-gates for providing a control voltage to the plurality of t-gates, and wherein the ground pad is coupled with the plurality of second field plates for providing the ground voltage to the plurality of second field plates.

7. The apparatus of claim 1, wherein the gate electrode comprises a first gate electrode, and wherein the apparatus further comprises:
 a second gate electrode disposed substantially equidistant from the source electrode and the first gate electrode; and
 a third gate electrode disposed substantially equidistant from the first gate electrode and the drain electrode.

8. The apparatus of claim 7, further comprising a third field plate coupled with the second gate electrode, and a fourth field plate coupled with the third gate electrode.

9. The apparatus of claim 8, further comprising:
 a fifth field plate proximately disposed to the third field plate and disposed substantially equidistant from the source electrode and the first gate electrode; and
 a sixth field plate proximately disposed to the fourth field plate and disposed substantially equidistant from the first gate electrode and the drain electrode.

10. The apparatus of claim 1, wherein the transistor is a field effect transistor selected from the group consisting of a high electron mobility transistor (HEMT), a pseudomorphic high electron mobility transistor (pHEMT), a laterally diffused metal oxide semiconductor transistor (LDMOS), and a metal epitaxial semiconductor field effect transistor (MESFET).

11. The apparatus of claim 1, wherein the first field plate is substantially flat such that opposing major surfaces are substantially parallel and opposing minor surfaces are substantially parallel.

12. The apparatus of claim 11, wherein the second field plate is substantially flat such that opposing major surfaces are substantially parallel and opposing minor surfaces are substantially parallel.

13. The apparatus of claim 1, wherein the second field plate is physically decoupled from the source electrode, the drain electrode, and the t-gate.

14. The apparatus of claim 1, further comprising a control pad coupled with the t-gate for providing a control voltage to the t-gate.

15. The apparatus of claim 14, further comprising a resistor coupled between the control pad and the t-gate.

16. The apparatus of claim 1, wherein the apparatus is a bi-directional switch.

17. A system comprising:
 a switch for selecting an RF signal, the switch including:
  a transistor including a channel layer, a barrier layer formed over the channel layer, a source electrode over the barrier layer, a drain electrode over the barrier layer, and a t-gate electrode recessed into the barrier layer, wherein the t-gate includes a gate electrode and a first field plate coupled with the gate electrode such that the gate electrode and the first field plate are disposed substantially equidistant from the source electrode and the drain electrode and the first field plate is configured to reduce an electric field between the source electrode and the gate electrode and between the drain electrode and the gate electrode;
  a second field plate separated from the first field plate by a dielectric layer and disposed substantially equidistant from the source electrode and the drain electrode, and configured to further reduce the electric field between the source electrode and the gate electrode and between the drain electrode and the gate electrode; and
  a ground pad coupled with the second field plate by an interconnect for providing a ground voltage to the second field plate, and the second field plate is electrically decoupled from the source electrode and the drain electrode;
 a power amplifier to amplify the RF signal coupled to the switch.

18. The system of claim 17, further comprising an antenna structure coupled with the power amplifier and configured to facilitate transmission of the amplified RF signal.

19. The system of claim 17, wherein the system is a radar device, a satellite communication device, a mobile handset, a base station, a broadcast radio, or a television amplifier system.

20. The system of claim 17, wherein the switch is a bi-directional switch.

* * * * *